United States Patent

Low et al.

[15] 3,694,700

[45] Sept. 26, 1972

[54] INTEGRATED CIRCUIT INCLUDING FIELD EFFECT TRANSISTOR AND CERMENT RESISTOR

[72] Inventors: George M. Low, Acting Administrator of the National Aeronautics and Space Administration to an invention of; George A. Brown, 919 Melrose, Richardson, Tex. 75080; Victor Harrap, 3603 High Vista Drive, Dallas, Tex.

[22] Filed: Feb. 19, 1971

[21] Appl. No.: 116,778

[52] U.S. Cl........317/101 A, 317/235 A, 317/235 AJ, 317/235

[51] Int. Cl...............................................H05k 3/10

[58] Field of Search.317/101 A, 235, 235 A, 235 AJ; 338/308

[56] References Cited

UNITED STATES PATENTS

| | | | |
|---|---|---|---|
| 3,607,480 | 9/1971 | Harrap | 317/235 |
| 3,590,272 | 6/1971 | Keshavan | 317/235 |
| 3,581,161 | 5/1971 | Cunningham et al. | 317/235 |
| 3,502,950 | 3/1970 | Nigh et al. | 317/235 |
| 3,507,716 | 4/1970 | Nishida et al. | 317/235 |
| 3,549,911 | 12/1970 | Scott, Jr. | 317/235 |
| 3,571,914 | 3/1971 | Lands et al. | 317/235 |
| 3,550,256 | 12/1970 | Deal | 317/235 |
| 3,518,494 | 6/1970 | James | 317/101 A |
| 3,597,667 | 8/1971 | Horn | 317/235 |
| 3,359,467 | 12/1967 | Cook | 338/308 X |
| 3,465,209 | 9/1969 | Denning et al. | 317/235 X |

OTHER PUBLICATIONS

IBM Technical Disclosure Bulletin, " Contact Opening In Shallow Junction Transistors," N. G. Anantha, Vol. 11, No. 7, p. 857, Dec. 1968.

*Primary Examiner*—J. R. Scott
*Attorney*—R. F. Kempf, Gerald M. Fisher and John R. Manning

[57] ABSTRACT

A single integrated circuit chip includes a field effect transistor having an insulating layer of silicon nitride covering an interface between a silicon substrate and a silicon oxide layer. A thin film cermet resistor on the nitride layer is connected to an ohmic contact of a field effect transistor electrode.

11 Claims, 3 Drawing Figures

INVENTORS,
GEORGE A. BROWN
VICTOR HARROP

INTEGRATED CIRCUIT INCLUDING FIELD EFFECT TRANSISTOR AND CERMENT RESISTOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

FIELD OF INVENTION

The present invention relates generally to integrated circuits and, more particularly, to a single chip carrying a field effect transistor including a nitride dielectric layer and a film cermet resistor connected to an electrode of the field effect transistor.

BACKGROUND OF THE INVENTION

Integrated circuits are preferably formed as a single chip, rather than a hybrid structure wherein active elements (transistors) and passive elements (resistors and capacitors) are mounted on separate chips. In addition to the obvious advantage of a single chip or substrate for an entire circuit requiring less space than a hybrid structure, single chip configurations provide greater reliability. Greater reliability is achieved because a single chip device requires fewer external connections and lead wires than a hybrid structure. By minimizing the number of connections, the possibility of poor contact or open circuits between elements is minimized during the fabrication process and circuit operation when components may be subjected to considerable force due to acceleration.

The advantages of cermet resistors, particularly chromium-silicon oxide (Cr-SiO), as thin resistors in integrated circuits have been appreciated in the past. Thin film cermet resistors have very low or zero temperature coefficients of resistance, whereby the resistance values are very stable under varying and widely divergent temperature ranges. Further, chromium-silicon oxide films are extremely stable as a function of humidity and age, whereby the resistance of the films remains constant. A further advantage of thin film cermet resistors, particularly with regard to integrated circuit uses, concerns the relatively high resistivity thereof, enabling a relatively small area on the integrated circuit substrate to be employed to obtain a relatively large resistance. Thin film cermet resistors are also very stable as a function of radiation level, an important feature in outer space applications.

Despite the advantages of utilizing cermet resistors in single chip integrated circuit structures, no prior art technique has been developed to enable such resistors to be formed on the same substrate or chip as a field effect transistor active element. In deposition of a cermet thin film, definition of the film to form a resistor of a prescribed value, and annealing of the film for stabilization, it has been found that sodium originating in the processes and in the atmosphere contaminates the silicon oxide dielectric layer of a silicon field effect transistor. Due to natural processes the contaminating sodium tends to concentrate at the interface between the silicon oxide dielectric layer and the silicon substrate. Sodium also contaminates the SiO2 and oxide-silicon interface while aluminum contacts are being deposited or various layers are etched by photolithographic techniques. Sodium and other ions in the silicon oxide-silicon interface alter the voltage response characteristics of a field effect transistor. Because the quantity of ions contaminating the interface cannot be predicted, there is a likelihood of a variable, unpredictable voltage characteristic of the resulting field effect transistor device.

Another prior art technique for forming resistors on the same chip as field effect transistors has involved a diffusion process. Economic processes in which resistors are formed by diffusion are limited to the formation of resistors having relatively small values; in addition they inherently form a junction, resulting in a relatively large capacitance. The junction capacitance reduces circuit response time and is subject to substantial variations as a function of ambient conditions of temperature, humidity and radiation level. Therefore, for high speed operation and widely varying ambient conditions, diffused resistors are not always satisfactory.

In accordance with the present invention, problems of the prior art in depositing a cermet resistor on the same silicon substrate as a field effect transistor are obviated by employing a nitride dielectric layer. The nitride dielectric layer covers all interfaces between the silicon oxide layer and the silicon substrate to prevent the migration of contaminants to the interface during the manufacturing process while the cermet resistor is being deposited. The nitride dielectric layer, which preferably is formed of silicon nitride ($Si_3N_4$), functions as a shield to passivate the silicon oxide-silicon interface against ions introduced during the processes of deposition, definition and annealing of a cermet thin film resistor.

It is accordingly, an object of the present invention to provide a new and improved integrated circuit wherein a film resistor is deposited on the same chip as an active element.

Another object of the invention is to provide a single substrate containing a field effect transistor and a cermet thin film resistor.

Another object of the invention is to provide a new and improved single chip integrated circuit including a field effect transistor and a resistive load therefor, wherein the resistive load has a very low temperature coefficient of resistance, is relatively immune to radiation, is stable as a function of humidity and age, and has a relatively high sheet resistivity.

Still another object of the present invention is to provide the combination of a field effect transistor with a resistive load on a single chip or substrate, wherein contamination of the field effect transistor during the formation of the film resistor is obviated.

Yet a further object of the present invention is to provide a single chip carrying a thin film resistor and a field effect transistor having a dielectric layer, wherein contaminants introduced during the deposition, definition and annealing of the resistor do not penetrate into the dielectric layer of the field effect device.

The above and still further objects, features and advantages of the present invention will become apparent upon consideration of the following detailed description of one specific embodiment thereof, especially when taken in conjunction with the accompanying drawings.

DETAILED DESCRIPTION OF THE FIGURES

Figure 1:
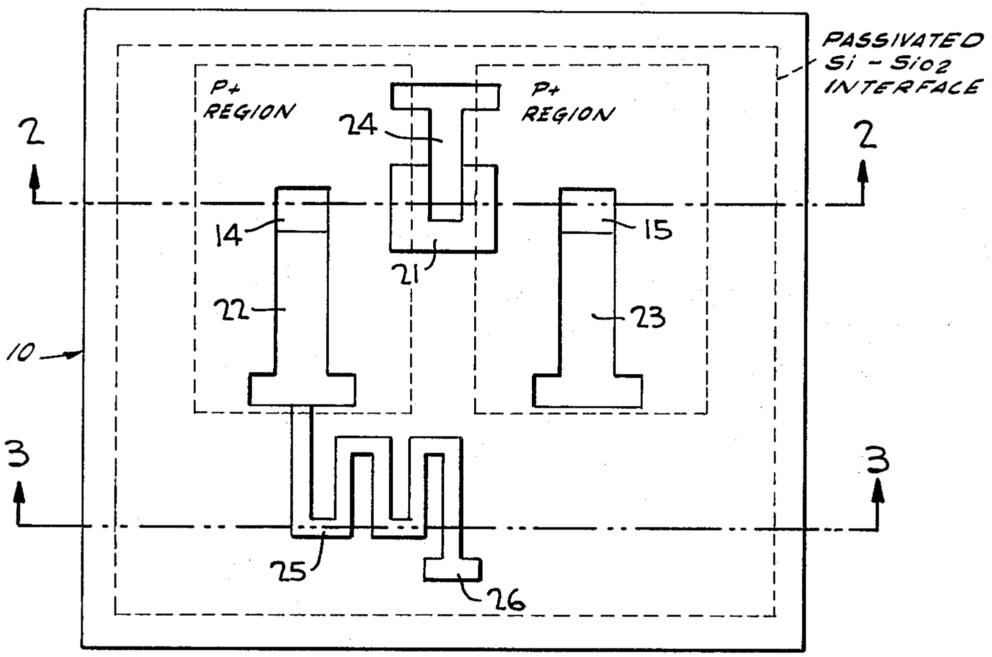
FIG. 1 is a top view of a simplified configuration in accordance with the present invention.
Figure 2:
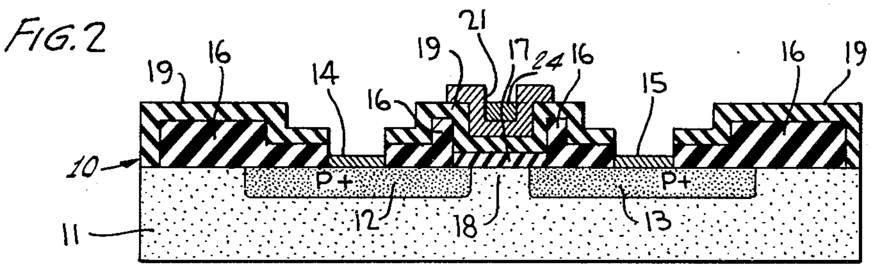
FIG. 2 is a side view, taken through the line 2—2, FIG. 1, of the field effect transistor.
Figure 3:
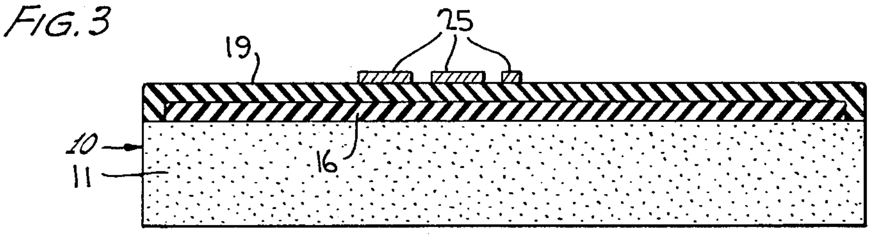
FIG. 3 is a side view, taken through the line 3—3, FIG. 1, illustrating a cermet thin film resistor.

Reference is now made to FIGS. 1–3 of the drawings wherein there is illustrated a single chip 10 carrying one field effect transistor in combination with a load resistor in accordance with the present invention. While only a single field effect transistor and one load resistor are illustrated as being formed on a single substrate in the Figures, it is to be understood that in an actual embodiment multiple transistors and resistors are fabricated on a single substrate or chip. The field effect transistor includes diffused P+ doped source and drain regions 12 and 13, respectively. Substrate 11 can be either of the intrinsic or lightly doped N-type silicon, doped to $3–4 \times 10^{14}$ atoms per cubic centimeter. Aluminum ohmic contracts 14 and 15 are respectively connected to doped regions 12 and 13 to form connections for source and drain electrodes. Covering the majority of the exposed surface of doped regions 12 and 13, as well as the exposed face of substrate 11, is a multi-layer dielectric means including silicon dioxide layers 16 and 17. Layer 17 covers a channel 18 in the substrate 11 between doped regions 12 and 13. Silicon dioxide layers 16 have a maximum thickness on the order of about 6,000 angstroms, while layer 17 covering channel 18 has a thickness on the order of 250 angstroms. The thickness of the portions of layer 16 adjacent contacts 14 and 15 is intermediate the maximum thickness of layer 16 and the thickness of layer 17, being on the order of 2,500 angstroms.

Covering silicon dioxide layers 16 and 17 is another portion of the multi-layer dielectric, namely a thin film layer 19 of silicon nitride, having a thickness of approximately 500 angstroms. Silicon nitride layer 19 covers the entire exposed surface of the circuit, except for the upper surfaces of aluminum, ohmic contacts 14 and 15, which is circumscribes. Thereby, the silicon nitride layer functions as a barrier protecting the interfaces between silicon oxide layers 16 and 17 and silicon substrates 11. Silicon oxide layers 16 and 17 in combination with silicon nitride layer 19 form a multi-layer dielectric coating means covering the substrate.

Covering and connected to nitride layer 19 of the multi-layer dielectric means in the vicinity of channel 18 is aluminum layer 21, which forms a gate electrode for the field effect transistor. Ohmic, thin film contacts 22, 23, and 24 are respectively deposited on electrodes 14, 15 and 21 to enable connections to be made to other circuit elements, e.g., contact pads, on substrate 11.

A thin film cermet resistance 25, preferably fabricated of silicon oxide-chromium, is ohmically connected to one end of contact 22 and to the aluminum film contact, pad 26. While chromium-silicon oxide is preferably employed as the cermet resistance 25, it is to be understood that other cermets, such as silver-magnesium fluoride ($Au\text{-}Mg\ F_2$), aluminum silicon oxide (Al-SiO), and chromium-magnesium fluoride ($Cr\text{-}MgF_2$) can be employed. Cermet resistor 25 is deposited as a thin film on silicon nitride layer 19 to a thickness of between 400 and 600 angstroms. Resistor 25 is of a generally sinuous shape, being formed of strips 0.4 mils in width with a 0.4 mil separation between adjacent strips. To achieve optimum temperature stability, that is, a thin film resistance having virtually a zero temperature coefficient of resistance, cermet resistance 25 is fabricated to have a resistivity on the order of 4,500 ohms per square.

To form the structure illustrated by FIGS. 1–3, the field effect transistor, which is termed a metal nitride oxide semiconductor field effect transistor (MNOSFET), is initially formed. A planar oxide layer having a thickness on the order of 6,000 angstroms is formed on substrate 11 yielding the silicon dioxide portions of layer 16 having the greatest thickness. After the silicon dioxide layer has been formed so that it has a thickness of 6,000 angstroms, windows for the P+ source and drain regions 12 and 13 are provided. P+ regions 12 and 13 are then formed utilizing standard planar diffusion techniques. Diffusion into the source-drain regions 12 and 13 is performed to a point just short of the desired final depth. While P+ regions 12 and 13 are being formed, a layer of silicon dioxide having a thickness of 2,500 angstroms is also formed.

Any oxide that might have been formed above channel 18 during the two oxidation steps is now removed from the channel region using photo resist techniques. The substrate is then transferred to a reactor where the 250 angstrom thick silicon oxide layer 17 is formed by oxidizing the channel. With the substrate still in the reactor, silicon nitride is deposited as layer 19 to a thickness on the order of 500 angstroms. While substrate 11 is in the reactor, drive in of the P+ region is completed so that the source and drain regions 12 and 13 extend within substrate 11 to the desired depth.

Substrate 11 is now removed from the reactor and contact patterns for electrodes 14, 15, and 21 are etched into dielectric layers 16 and 19. Silicon dioxide layer 16 is etched utilizing a standard etchant and pattern while a different etchant, phosphoric acid ($H_3PO_4$), is utilized to etch the pattern through layer 19. Electrodes 14, 15 and 21 are deposited utilizing aluminum as a metalization process over the exposed portions of the substrate. Simultaneously with the formation of electrodes 14, 15, and 21 for the field effect transistor, contacts 22–24 and 26 are formed on silicon nitride layer 19. As contacts 22–24 and 26 are formed, a thin film layer of aluminum is deposited on nitride layer 19 in the general area to be occupied by the cermet resistor 25. Thereafter, using a photolithographic technique, the aluminum layer under the exact region to be occupied by cermet resistor 25 is removed. The cermet resistor is now deposited as a thin film on the exposed portion of nitride layer 19.

The cermet resistor is formed as a thin film layer utilizing vacuum vapor deposition techniques. Any ions that might have a tendency to be deposited on the substrate during the deposition process adhere only to silicon nitride layer 19 and do not penetrate layer 19 to the interfaces between silicon substrate 11 and silicon dioxide layers 16 or 17. This is desirable because ionic migration, particularly of sodium, to the interfaces between the silicon dioxide and silicon has a tendency to change the current voltage characteristics of a field effect transistor having a metal oxide semiconductor configuration.

In a typical technique employed for depositing a chromium-silicon monoxide cermet resistor 25, the substrate is positioned in a vacuum vapor deposition bell jar maintained at a pressure on the order of $10^{-5}$ torr. A cermet charged powder comprising a mixture of 80 percent chromium and 20 percent silicon monoxide by weight is deposited in an evaporation boat. The substrate is outgassed by being raised to a temperature of 450° C and its temperature is then lowered to 200° C preparatory to the cermet deposition step. The cermet mixture is outgassed by heating the boat to a temperature of about 500° C with a shutter between the boat and substrate in a closed position. After the outgassing operations have been completed, the temperature of the cermet mixture in the boat is raised to an average value on the order of 1,200° C and the shutter is generally, although not necessarily open; in either shutter configuration cermet vapor flows from the boat to the substrate. After cermet has been deposited to form film 25 to a thickness on the order of 500 angstroms, deposition is terminated by reducing the temperature of the mixture in the boat. Thereafter, the substrate is annealed at a temperature of at least 400° C, and preferably at 500° C, for a period on the order of 60 minutes.

The next operation involves defining the shape of resistor 25. It is performed by immersing substrate 11, after removal from the bell jar, in a 0.1 normal potassium hydroxide (KOH) solution at room temperature. With the slice in the potassium hydroxide solution, the solution is supplied with ultrasonic energy until the resistor pattern is defined. The ultrasonic step is important to assist penetration of potassium hydroxide to aluminum underlying the cermet, whereby dissolution of the aluminum takes place followed by dislodgement of the cermet overlayer. It has been found that the time required to etch the resistor pattern is on the order of 20 to 30 minutes. The etching step is followed by a 5-minute rinse of the entire substrate in deionized water.

After the resistor has been etched, a layer of aluminum is evaporated over the entire slice. Thereafter, conventional photolithographic techniques are employed for defining aluminum contacts and connections to external devices. The final step is to anneal and alloy the entire slice at a temperature of 400° C for 30 minutes in a dry nitrogen environment. This is a dual purpose step designed to lower contact resistance and simultaneously finally anneal cermet film 25.

Field effect transistors and load resistor 25 therefor constructed in accordance with the described technique have been found to exhibit stable operating conditions as a function of temperature, humidity, age, and radiation. Further, the voltage characteristics of differing field effect transistors fabricated on differing substrates have been relatively consistent and predictable.

While there has been described and illustrated one specific embodiment of the invention, it will be clear that variations in the details of the embodiment specifically illustrated and described may be made without departing from the true spirit and scope of the invention as defined in the appended claims.

We claim:

1. An integrated circuit comprising a non-metallic substrate, first and second doped semiconductor regions formed in said substrate, said regions being similarly doped and separated from each other by a channel of the substrate, whereby said regions form source and drain electrodes of a field effect transistor, a separate ohmic contact connected to each of said regions, multi-layer dielectric coating means covering the substrate, including the channel, and portions of the regions but leaving the ohmic contacts exposed, said multi-layer dielectric coating means including a dielectric layer having interfaces with the substrate, said interfaces having exposed edges, said multi-layer coating means including nitride dielectric layer completely covering the exposed edges of the interfaces to passivate the interfaces and circumscribing said doped semiconductor region ohmic contacts, another ohmic contact connected to the silicon nitride layer portion of the multi-layer dielectric coating covering the channel, said separate ohmic contacts forming source and drain electrode terminals, said another ohmic contact forming a gate electrode terminal and a thin film cermet resistor on said nitride layer connected to one of said contacts.

2. The circuit of claim 1 wherein the substrate is silicon and the first dielectric layer is a silicon oxide.

3. The circuit of claim 1 wherein the substrate is silicon and the first dielectric layer is silicon dioxide.

4. The circuit of claim 1 wherein the cermet resistor is Cr-SiO

5. The circuit of claim 4 wherein the Cr-SiO resistor is a film having a thickness on the order of 500 angstroms.

6. The circuit of claim 1 wherein the substrate is silicon and the first and second dielectric layers are silicon oxide and silicon nitride, respectively.

7. The circuit of claim 6 wherein the silicon oxide layer covering the channel has a thickness on the order of 250 angstroms, and the silicon nitride layer has a thickness on the order of 500 angstroms.

8. The circuit of claim 7 wherein the silicon oxide layer covering the substrate, other than the channel, has a thickness of at least 2,500 angstroms.

9. The circuit of claim 8 wherein the cermet resistor is Cr-SiO formed as a film having a thickness on the order of 500 angstroms.

10. The circuit of claim 6 wherein the cermet resistor is Cr-SiO

11. The circuit of claim 9 wherein the resistor has a resistivity on the order of 4,500 ohms per square.

* * * * *